United States Patent
Kumaki et al.

(10) Patent No.: US 7,598,670 B2
(45) Date of Patent: Oct. 6, 2009

(54) LIGHT EMITTING ELEMENT AND LIGHT EMITTING DEVICE

(75) Inventors: Daisuke Kumaki, Nigata (JP); Hisao Ikeda, Kanagawa (JP); Hiroko Abe, Tokyo (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 267 days.

(21) Appl. No.: 10/593,193

(22) PCT Filed: May 17, 2005

(86) PCT No.: PCT/JP2005/009313
§ 371 (c)(1),
(2), (4) Date: Sep. 15, 2006

(87) PCT Pub. No.: WO2005/115060
PCT Pub. Date: Dec. 1, 2005

(65) Prior Publication Data
US 2007/0182318 A1    Aug. 9, 2007

(51) Int. Cl.
H01J 63/04    (2006.01)
(52) U.S. Cl. .................. 313/506; 428/690; 428/917
(58) Field of Classification Search ......... 313/500–512; 428/690, 917
See application file for complete search history.

(56) References Cited

U.S. PATENT DOCUMENTS

| | | | |
|---|---|---|---|
| 5,849,403 A | 12/1998 | Aoki et al. | |
| 6,013,384 A | 1/2000 | Kido et al. | |
| 6,107,734 A | 8/2000 | Tanaka et al. | |
| 6,573,650 B2 | 6/2003 | Aoki et al. | |
| 6,650,047 B2 | 11/2003 | Aoki et al. | |
| 6,831,406 B1 | 12/2004 | Fukuyama et al. | |
| 6,872,472 B2 | 3/2005 | Liao et al. | |

(Continued)

FOREIGN PATENT DOCUMENTS

CN    1327360 A    12/2001

(Continued)

OTHER PUBLICATIONS

Ganzorig. C. et al, "Improved drive voltages of organic electroluminescent devices with an efficient p-type aromatic diamine hole-injection layer," Applied Physics Letters, vol. 77, No. 25, pp. 4211-4213, (Dec. 18, 2000).

(Continued)

Primary Examiner—Nimeshkumar D. Patel
Assistant Examiner—Mary Ellen Bowman
(74) Attorney, Agent, or Firm—Cook Alex Ltd.

(57) ABSTRACT

A light emitting element of the invention includes n pieces of light emitting layers (n is a natural number) between first and second electrodes. A first layer and a second layer are provided between the $m^{th}$ light emitting layer (m is a natural number of $1 \leq m \leq n$) and the $m+1^{th}$ light emitting layer. The first and second layers are contacted to each other. The first layer contains a substance that transports holes easily and a substance with an electron accepting property. The second layer contains a substance that transports electrons easily and a substance with an electron donating property. Molybdenum oxide is used as the substance with the electron accepting property.

12 Claims, 11 Drawing Sheets

U.S. PATENT DOCUMENTS

| | | |
|---|---|---|
| 7,323,225 B2 | 1/2008 | Aoki et al. |
| 2001/0046611 A1 | 11/2001 | Kido et al. |
| 2003/0048072 A1* | 3/2003 | Ishihara et al. ............. 313/506 |
| 2003/0127967 A1 | 7/2003 | Tsutsui et al. |
| 2003/0189401 A1 | 10/2003 | Kido et al. |
| 2003/0218166 A1 | 11/2003 | Tsutsui |
| 2004/0027059 A1 | 2/2004 | Tsutsui |
| 2004/0150333 A1 | 8/2004 | Tsutsui |
| 2004/0227460 A1 | 11/2004 | Liao et al. |
| 2005/0029933 A1 | 2/2005 | Liao et al. |
| 2005/0062405 A1* | 3/2005 | Peng ......................... 313/504 |
| 2005/0084712 A1 | 4/2005 | Kido et al. |
| 2005/0098207 A1 | 5/2005 | Matsumoto et al. |
| 2005/0106419 A1 | 5/2005 | Endoh et al. |
| 2005/0170208 A1 | 8/2005 | Yatsunami et al. |
| 2005/0248267 A1 | 11/2005 | Gyoutoku et al. |
| 2006/0008740 A1 | 1/2006 | Kido et al. |
| 2007/0200125 A1 | 8/2007 | Ikeda et al. |

FOREIGN PATENT DOCUMENTS

| | | |
|---|---|---|
| CN | 1438828 A | 8/2003 |
| EP | 0 948 063 A2 | 10/1999 |
| EP | 1 056 141 A2 | 11/2000 |
| EP | 1 128 438 A1 | 8/2001 |
| EP | 1 339 112 A2 | 8/2003 |
| EP | 1 351 558 A1 | 10/2003 |
| EP | 1 478 025 A2 | 11/2004 |
| EP | 1 530 245 A2 | 5/2005 |
| JP | 09-063771 | 3/1997 |
| JP | 10-270172 | 10/1998 |
| JP | 11-251067 | 9/1999 |
| JP | 11-307259 | 11/1999 |
| JP | 11-307264 | 11/1999 |
| JP | 11-329748 | 11/1999 |
| JP | 2003-045676 | 2/2003 |
| JP | 2003-272860 | 9/2003 |
| JP | 2005-26121 | 1/2005 |
| JP | 2005-166637 | 6/2005 |

OTHER PUBLICATIONS

Endo, J. et al, "Organic Electroluminescent Devices with a Vacuum-Deposited Lewis-Acid-Doped Hole-Injecting Layer," Japanese Journal of Applied Physics, vol. 41, pp. L358-L360, (2002).

Nakada, T. et al, "Multi Photon Emission Organic EL Devices using Charge-Transfer Complex as Charge Generation Layer," Proceedings of the Lecture Meeting of the Union Allied with the Japan Society of Applied Physics, The 63$^{rd}$ Autumn meeting, p. 1165, (Sep. 24, 2002); with full English translation.

Liao, L. S. et al, "High-efficiency tandem organic light-emitting diodes," Applied Physics Letters, vol. 84, No. 2, pp. 167-169, (Jan. 12, 2004).

Tsutsui, T. et al, "Electric field-assisted bipolar charge spouting in organic thin-film diodes," Applied Physics Letters, vol. 84, No. 3, pp. 440-442, (Jan. 19, 2004).

International Search Report re application No. PCT/JP2005/009313, dated Sep. 13, 2005.

Written Opinion re application No. PCT/JP2005/009313, dated Sep. 13, 2005.

Office Action re Chinese application No. CN 200580024622.7, dated Aug. 22, 2008 (with English translation).

* cited by examiner

LIGHT EMITTING ELEMENT AND LIGHT EMITTING DEVICE

TECHNICAL FIELD

The present invention relates to a light emitting element having a light emitting layer between a pair of electrodes, and in particular, relates to a layer structure of the light emitting element.

BACKGROUND ART

A light emitting device utilizing light emitted from an electroluminescent element (a light emitting element) has wide-viewing angle and low power consumption. In recent years, research and development of a light emitting device, which can provide high quality images for the long term, have been carried out actively in the development area of light emitting devices so as to dominate the market for display devices that are applied to various kinds of information processing devices such as a television receiver and a car navigation system.

In order to obtain a light emitting device, which can provide high quality images for the long term, development of a long-life light emitting element and a light emitting element that emits light efficiently becomes important.

For example, the patent document 1 discloses a technique related to a light emitting element with a plurality of light emitting units in which the respective light emitting units are separated by a charge generating layer. The patent document 1 describes a long-life light emitting element with high luminance. However, vanadium pentoxide used in the patent document 1 has a high moisture absorbing property. Therefore, the light emitting element is possibly deteriorated due to moisture absorbed by vanadium pentoxide. The deterioration of the light emitting element results in deterioration of image quality in a light emitting device.

Accordingly, in the development of light emitting devices, it is also important to manufacture a light emitting element having a high moisture resistant property along with high luminance.

[Patent Document 1] Japanese Patent Application Laid-Open No. 2003-272860.

DISCLOSURE OF INVENTION

It is an object of the present invention to provide a light emitting element with an excellent moisture resistant property. In particular, it is an object of the invention to provide a light emitting element with an excellent moisture resistant property that can emit white light.

In an aspect of the invention, a light emitting element includes a layer containing a substance with an electron accepting property. As the substance with the electron accepting property, molybdenum oxide is used.

In another aspect of the invention, a light emitting element includes n pieces of light emitting layers (n is a natural number) between a first electrode and a second electrode. The light emitting element further includes a first layer and a second layer between the $m^{th}$ light emitting layer (m is a natural number: $1 \leq m \leq n$) and the $m+1^{th}$ light emitting layer. The first and second layers are contacted to each other. The first layer contains a substance that transports holes easily and a substance with an electron accepting property. The second layer contains a substance that transports electrons easily and a substance with an electron donating property. In addition, molybdenum oxide is used as the substance with the electron donating property.

In another aspect of the invention, a light emitting element includes n pieces of layer groups (n is a natural number) each of which has a first layer, a second layer and a light emitting layer, between a pair of electrodes. The first layer includes a substance that transports holes easily and a substance with an electron accepting property. The second layer includes a substance that transports electrons easily and a substance with an electron donating property. In the n pieces of layer groups, the first layer included in the $m^{th}$ layer group (m is a natural number: $1 \leq m \leq n$) and the second layer included in the $m+1^{th}$ layer group are laminated to be in contact with each other.

In another aspect of the invention, a light emitting element includes n pieces of light emitting layers (n is a natural number) between a first electrode and a second electrode. The second electrode reflects light more easily as compared with the first electrode. The light emitting element further includes a first layer and a second layer between the $m^{th}$ light emitting layer (m is a natural number: $1=m=n$) and the $m+1^{th}$ light emitting layer. Further, the first and second layers are contacted to each other. The first layer includes a substance that transports holes easily and a layer with an electron accepting property. The second layer includes a substance that transports electrons easily and a substance with an electron donating property. The $m+1^{th}$ light emitting layer exhibits a shorter peak wavelength of emission spectrum than that of the $m^{th}$ light emitting layer. The n pieces of light emitting layers are provided such that the $m+1^{th}$ light emitting layer is placed closer to the second electrode than the $m^{th}$ light emitting layer.

In another aspect of the invention, a light emitting element includes n pieces of light emitting layers (n is a natural number) between a first electrode and a second electrode. The second electrode reflects light more easily as compared with the first electrode. The light emitting element further includes a first layer and a second layer between the $m^{th}$ light emitting layer (m is a natural number: $1=m=n$) and the $m+1^{th}$ light emitting layer. The first and second layers are contacted to each other. The first layer contains a substance that transports holes easily and a substance with an electron accepting property. The second layer contains a substance that transports electrons easily and a substance with an electron donating property. The n pieces of light emitting layers are provided such that the light emitting layer exhibiting a shorter peak wavelength of emission spectrum is provided closer to the second electrode.

According to the present invention, a light emitting element with an excellent moisture resistant property can be obtained so that the light emitting element is hardly deteriorated by moisture intruding into the light emitting element. Also, a light emitting element that emits white light can be provided. In addition, since an interference of light emitted from the light emitting element and reflected light is hardly caused in the light emitting element of the invention, color tone of light emitted from the light emitting element can be controlled easily.

BEST MODE FOR CARRYING OUT THE INVENTION

The embodiment modes and embodiments according to the present invention will hereinafter be described referring to the accompanying drawings and the like. Further, the present invention can be carried out in many different modes. It is easily understood by those who skilled in the art that the embodiment modes and details herein disclosed can be modified in various ways without departing from the purpose and the scope of the invention. The present invention should not be interpreted as being limited to the description of the embodiment modes to be given below.

Embodiment Mode 1

Figure 1:
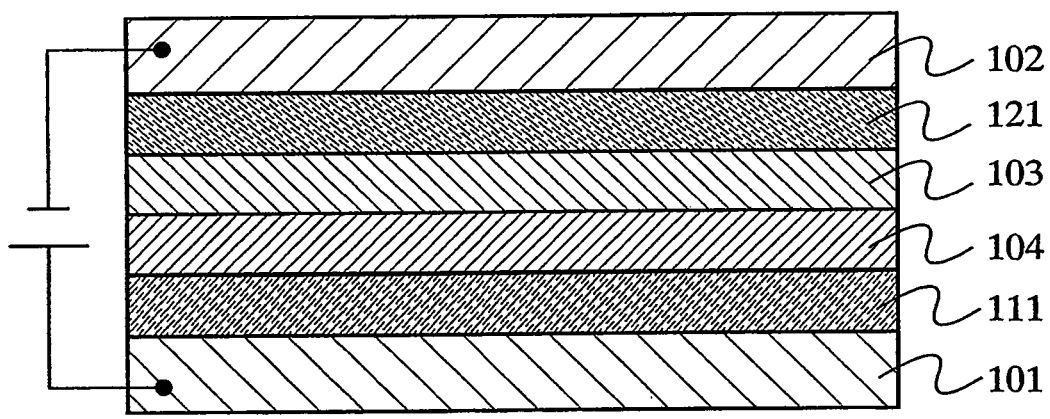
FIG. 1 is a diagram explaining a light emitting element of the present invention.

In FIG. 1, a first layer 103 containing a substance that transports holes easily and a substance with an electron accepting property and a second layer 104 containing a substance that transports electrons easily and a substance with an electron donating property are provided between a first electrode 101 and a second electrode 102. The first layer 103 and the second layer 104 are laminated in contact with each other. Further, holes are generated in the first layer 103 containing the substance that transports holes easily and the substance with the electron accepting property whereas electrons are generated in the second layer 104 containing the substance that transports electrons easily and the substance with the electron donating property.

Also, a first light emitting layer 111 is provided between the first electrode 101 and the first layer 103. A second light emitting layer 121 is provided between the second electrode 102 and the second layer 104.

Further, in this embodiment mode, the first electrode 101 serves as an anode and the second electrode 102 serves as a cathode. Preferably, one or both of the first electrode 101 and the second electrode 102 is/are made from a substance that transmits visible light easily.

A substance for the first electrode 101 is not particularly limited. In order to form the first electrode 101 serving as the anode as well as this embodiment mode, the first electrode is preferably made from a substance with a high work function such as indium tin oxide, indium tin oxide containing silicon oxide, indium zinc oxide in which 2 to 20% zinc oxide is mixed in indium oxide, and gallium zinc oxide in which several % gallium oxide is mixed in zinc oxide. Further, the electrode made from the above-mentioned substance with the high work function transmits visible light easily.

In addition, a substance for the second electrode 102 is not particularly limited. In order to form the second electrode 102 serving as the cathode as well as this embodiment mode, the second electrode is preferably made from a substance with a low work function such as aluminum containing alkali metal (e.g., lithium (Li), magnesium and the like), alkali earth metal or the like.

The substance that transports holes easily is not particularly limited. For example, the substance that transports holes easily can be made from an aromatic amine (i.e., one having a benzene ring-nitrogen bond) compound such as: 4,4'-bis(N-[1-naphthyl]-N-phenyl-amino)-biphenyl (abbreviation: α-NPD); 4,4'-bis(N-[3-methylphenyl]-N-phenyl-amino)-biphenyl (abbreviation: TPD); 4,4',4"-tris(N,N-diphenyl-amino)-triphenylamine (abbreviation: TDATA); and 4,4',4"-tris(N-(3-methylphenyl)-N-phenyl-amino)-triphenylamine (abbreviation: MTDATA).

The substance with the electron accepting property is not particularly limited. For example, a substance with a low moisture absorbing property such as molybdenum oxide is preferably employed.

The substance that transports electrons easily is not particularly limited. For example, the substance that transports electrons easily can be made from a metal complex having quinoline skeleton or benzoquinoline skeleton such as: tris(8-quinolinolate)aluminum (abbreviation: Alq$_3$); tris(4-methyl-8-quinolinolate)aluminum (abbreviation: Alq$_3$); bis(10-hydroxybenzo[h]-quinolinato)beryllium (abbreviation: BeBq$_2$); and bis(2-methyl-8-quinolinolate)-4-phenylphenolate-aluminum (abbreviation: BAlq).

The substance with the electron donating property is not particularly limited. For example, alkali metal such as lithium, alkali earth metal such as magnesium and the like can be used. In addition, alkali metal oxide such as lithium oxide, alkali metal nitride such as lithium nitride, alkali earth metal oxide such as magnesium oxide, alkali earth metal nitride such as magnesium nitride may be employed.

The first light emitting layer 111 and the second light emitting layer 121 contain a light emitting substance, respectively. The light emitting substance mentioned above indicates a substance with a favorable light emitting efficiency exhibiting light emission of a predetermined wavelength. Further, the first and second light emitting layers 111 and 121 may contain different light emitting substances from each other The first and second light emitting layers 111 and 121 are not particularly limited. Each layer may be made from a layer containing one kind of substance or a layer in which plural kinds of substances are mixed. For instance, any one or both of the first and second light emitting layers 111 and 121 may be made from only a light emitting substance. Alternatively, any one or both of the first and second light emitting layers may be formed of a mixed layer of a light emitting substance and other substance. As the substance used in combination with the light emitting substance, a substance having a larger energy gap than that of the light emitting substance is preferably used. In this embodiment mode, the energy gap indicates an energy gap between the LUMO level and the HOMO level.

The light emitting substance is not particularly limited. In order to obtain red light emission, for example, the following substances exhibiting emission spectrum with peaks of at 600 nm to 680 nm can be employed: 4-dicyanomethylene-2-isopropyl-6-(2-[1, 1,7,7-tetramethyljulolidine-9-yl]ethenyl)-4H-pyran (abbreviation: DCJTI; 4-dicyanomethylene-2-methyl-6-(2-[1,1,7,7-tetramethyljulolidine-9-yl]ethenyl)-4H-pyr an (abbreviation: DCJT); 4-dicyanomethylene-2-tert-butyl-6-(2-[1,1,7,7-tetramethyljulolidine-9-yl]ethenyl)-4H-p yran; periflanthene; 2,5-dicyano-1,4-bis(2-[10-methoxy-1,1,7,7-tetramethyljulolidine-9-yl]ethenyl)

benzene and the like. In order to obtain green light emission, substances exhibiting emission spectrum with peaks at 500 nm to 550 nm such as N,N'-dimethyl-quinacridon (abbreviation: DMQd), coumarin 6, coumarin 545T, and tris(8-quinolinolate)aluminum (abbreviation: Alq$_3$) can be employed. In order to obtain blue light emission, the following substances exhibiting emission spectrum with peaks at 420 nm to 480 nm can be employed: 9,10-bis(2-naphthyl)-tert-butylanthracene (abbreviation: t-BuDNA); 9, 9'-bianthryl; 9,10-diphenylanthracene (abbreviation: DPA); 9,10-bis(2-naphthyl)anthracene (abbreviation: DNA); bis(2-methyl-8-quinolinolate)-4-phenylphenolate-gallium (abbreviation: BGaq); bis(2-methyl-8-quinolinolate)-4-phenylphenolate-aluminum (abbreviation: BAlq); and the like.

In the above-mentioned light emitting elements, when a voltage is applied to the first and second electrodes 101 and 102, holes are injected in the first light emitting layer 111 from the first electrode 101, and electrons are injected in the first light emitting layer 111 from the first layer 103. Also, holes are injected in the second light emitting layer 121 from the second electrode 102. Electrons are injected in the second light emitting layer 121 from the second layer 104. Accordingly, the holes and electrons are recombined in the first and second light emitting layers 111 and 121 so that the light emitting substance is excited. The light emitting substance emits light upon returning to a ground state from the excitation state.

Further, when a color of light emitted from the first emitting layer 111 and a color of light emitted from the second light emitting layer 121 are complementary to each other, the human eye detects the light emitted from both the light emitting elements as white. In this case, when the reflectance of the first electrode 101 is different from that of the second electrode 102 and the peak wavelengths of emission spectrum of light emitted from the respective light emitting layers (i.e., wavelengths of maximum emission intensity in the case of inspecting the emission spectrums) are different from each other, the respective light emitting layers are preferably arranged such that the light emitting layer with a shorter peak wavelength is placed closer to the electrode with the high reflectance. Further, the peak wavelength indicates a wavelength exhibiting a peak with a strongest emission intensity in the emission spectrum having a plurality of peaks. For example, in the case where the first electrode 101 is made from indium tin oxide or the like and transmits visible light easily while the second electrode 102 is made from aluminum or the like and reflects light easily, the first light emitting layer 111, which is placed closest to the first electrode 101, is preferably a light emitting layer that emits blue light and the second light emitting layer 121, which is placed closest to the second electrode 102, is preferably a light emitting layer that emits yellow light. Therefore, the light interference caused by reflecting light emitted from the light emitting layers at the second electrode 102 can be reduced.

Furthermore, only the first light emitting layer 111 may be provided between the first electrode 101 and the first layer 103 in the same manner as this embodiment mode. Alternatively, a hole transporting layer and the like may be provided therebetween, besides the first light emitting layer 111. Meanwhile, only the second light emitting layer 121 may be provided between the second electrode 102 and the second layer 104 as shown in this embodiment mode. Alternatively, an electron transporting layer and the like may be provided therebetween, besides the second light emitting layer 121.

Since the above-described light emitting element according to the invention is formed by using a substance with a low water absorbing property such as molybdenum oxide, the light emitting element is hardly deteriorated by moisture intruding into the light emitting element. In addition, the light emitting element of this embodiment mode can emit white light. Moreover, the interference of light emitted from the light emitting layers and reflected light is hardly caused in the light emitting element of this embodiment mode, and hence, color tone of light emitted from the light emitting layers can be controlled easily.

Embodiment Mode 2

Figure 2:
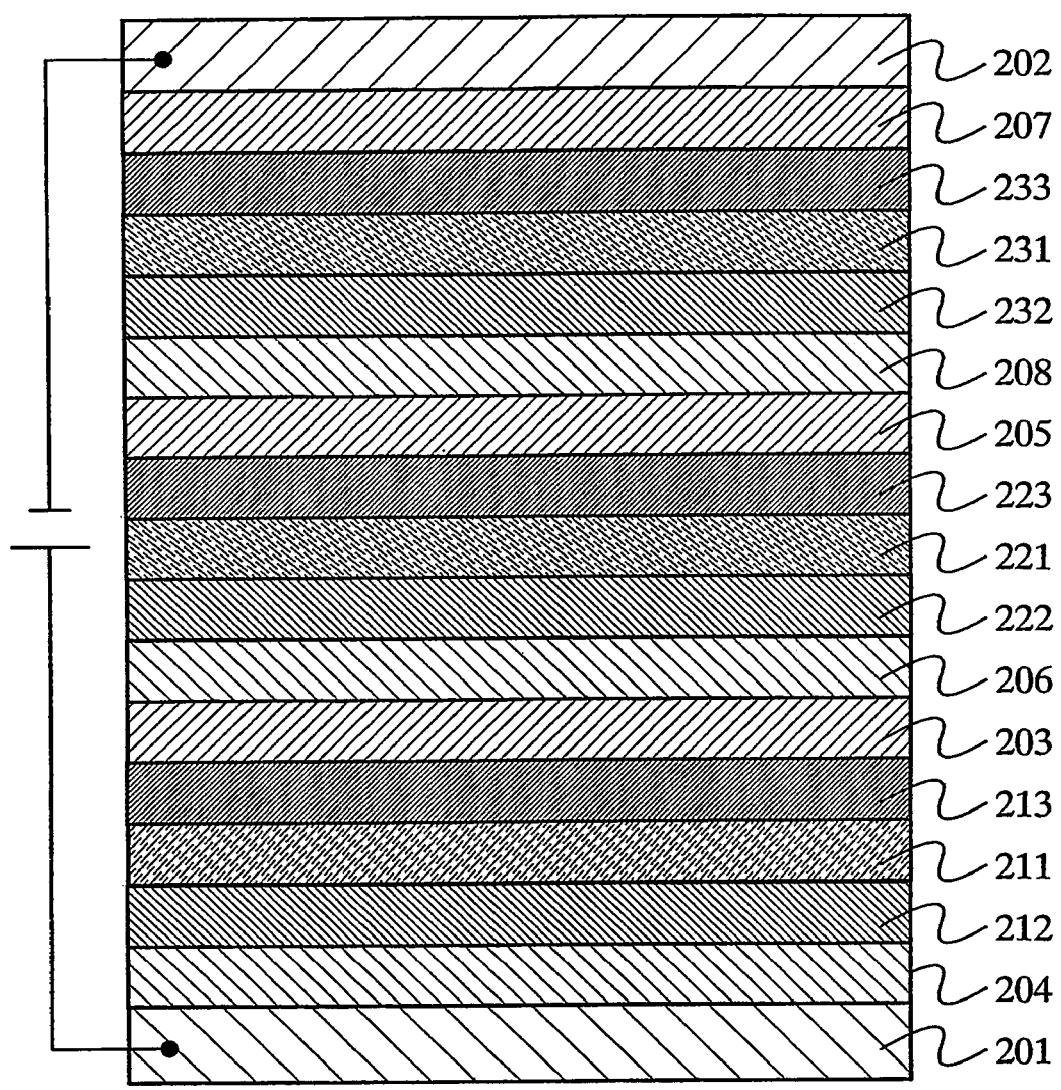
FIG. 2 is a diagram explaining a light emitting element of the invention.

The present embodiment mode will describe a light emitting element of the invention including three light emitting layers with reference to FIG. 2.

In FIG. 2, first layers 203, 205 and 207 including a substance that transports electrons easily and a substance with an electron donating property, and second layers 204, 206 and 208 including a substance that transports holes easily and a substance with an electron accepting property are provided between a first electrode 201 and a second electrode 202. In this case, the first layer 203 is formed in contact with the first electrode 201. The second layer 208 is formed in contact with the second electrode 202. The first layer 205 and the second layer 204 are laminated to be in contact with each other. The first layer 207 and the second layer 206 are laminated to be in contact with each other. Holes are generated in the first layers 203, 205 and 207 including the substance that transports holes easily and the substance with the electron accepting property whereas electrons are generated in the second layers 204, 206 and 208 including the substance that transports electrons easily and the substance with the electron donating property.

In this embodiment mode, the first electrode 201 serves as an anode and the second electrode 202 serves as a cathode. A first light emitting layer 211 is provided between the first layer 203 and the second layer 204. A second light emitting layer 221 is provided between the first layer 205 and the second layer 206. A third light emitting layer 231 is provided between the first layer 207 and the second layer 208. A hole transporting layer 212 is provided between the second layer 204 and the first light emitting layer 211. A hole transporting layer 222 is provided between the second layer 206 and the second light emitting layer 221. A hole transporting layer 232 is provided between the second layer 208 and the third light emitting layer 231. In this case, the hole transporting layers represent layers that can transport holes to the light emitting layers and contain a substance, which transport holes easily. An electron transporting layer 213 is provided between the first layer 203 and the first light emitting layer 211. An electron transporting layer 223 is provided between the first layer 205 and the second light emitting layer 221. An electron transporting layer 233 is provided between the first layer 207 and the third light emitting layer 231. These electron transporting layers represent layers that can transport electrons to the light emitting layers and contain a substance, which transports electrons easily. By providing these hole transporting layers and these electron transporting layers, the light emitting layers can be separated from the layers containing metal, thereby preventing light quenching caused by metal.

The substance that transports holes easily, the substance with the electron accepting property, the substance that transports electrons easily, and the substance with the electron donating property are identical to those described in Embodiment Mode 1. The substances described in Embodiment Mode 1 can be used. Further, as the substance with the electron accepting property, a substance with a low moisture absorbing property such as molybdenum oxide is preferably used in this embodiment mode.

The first electrode 201 serves as the anode and the second electrode 202 serves as the cathode. Therefore, the first electrode 201 is preferably made from a substance with a high work function as well as the first electrode 101 of Embodiment Mode 1. Also, the second electrode 202 is preferably made form a substance with a low work function as well as the second electrode 102 of Embodiment Mode 1. Preferably, one or both of the first electrode 201 and the second electrode 202 is/are made from a substance that transmits visible light easily.

The hole transporting layers 212, 222 and 232 correspond to layers containing a substance that transports holes easily, respectively. The hole transporting layers 212, 222 and 232 are not particularly limited. These hole transporting layers may contain different kinds of substances that transport holes easily or the same substance that transports holes easily. In addition, the hole transporting layers 212, 222 and 232 may contain one or more kinds of substances that transport holes easily, respectively. The hole transporting layers 212, 222 and 232 may include a single layer or plural layers, respectively. Further, the substances that transport holes easily are identical to the substance that transports holes easily as mentioned in Embodiment Mode 1.

The electron transporting layers 213, 223 and 233 contain a substance that transports electrons easily, respectively. The electron transporting layers 213, 223 and 233 are not particularly limited. The electron transporting layers may contain different kinds of substances that transport electrons easily or the same substance that transports electrons easily. The electron transporting layers 213, 223 and 233 may contain one or more kinds of substances that transport electrons easily, respectively. The electron transporting layers 213, 223 and 233 may include one layer or plural layers, respectively. Further, the substances that transport electrons easily are identical to the substance that transports electrons easily as described in Embodiment Mode 1.

The first light emitting layer 211, the second light emitting layer 221 and the third light emitting layer 231 contain light emitting substances, respectively. The light emitting substances are identical to the light emitting substance described in Embodiment Mode 1, and therefore, the light emitting substance of Embodiment Mode 1 can be employed here. In addition, the light emitting substances included in the first light emitting layer 211, the second light emitting layer 221 and the third light emitting layer 231 may be different from one another. Further, the first light emitting layer 211, the second light emitting layer 221 and the third light emitting layer 231 are not particularly limited. Each light emitting layer may include one kind of substance or a mixture of different kinds of substances. For instance, any one or more of the first light emitting layer 211, the second light emitting layer 221 and the third light emitting layer 231 may be made from only a light emitting substance. Alternatively, any one or more of the light emitting layers may be made from a mixture of a light emitting substance and another substance. As the substance used in combination with the light emitting substance, a substance having a larger energy gap than that of the light emitting substance is preferably used. In this case, the energy gap indicates an energy gap between the LUMO level and the HOMO level.

When any one of the first light emitting layer 211, the second light emitting layer 221 and the third light emitting layer 231 emits red light, another one emits green light and another one emits blue light, the human eye detects light emitted from the light emitting element as white. In the case where the light reflectance of the first electrode 201 is different from that of the second electrode 202 and the peak wavelengths of emission spectrum of the respective light emitting layers are different from each other, the respective light emitting layers are preferably arranged such that the light emitting layer with a shorter peak wavelength is placed closer to the electrode having the high reflectance. Further, the peak wavelength indicates a wavelength exhibiting a peak with a strongest emission intensity in the emission spectrum having plural peaks. For example, when the first electrode 201 is made from indium tin oxide or the like and transmits visible light easily while the second electrode 202 is made from aluminum or the like and reflects light easily, the first light emitting layer 211 placed closest to the first electrode 201 preferably corresponds to a light emitting layer that emits red light and the third light emitting layer 231 placed closest to the second electrode 202 preferably corresponds to a light emitting layer that emits blue light. Accordingly, light interference caused by reflecting light emitted from the light emitting layers at the second electrode 202 can be reduced.

Since the above-mentioned light emitting element is formed by using the substance with the low moisture absorbing property such as molybdenum oxide, the light emitting element is hardly deteriorated by moisture intruding into the light emitting element. In addition, the light emitting element of this embodiment mode can emit white light. Moreover, interference of light emitted from the light emitting layers and reflected light is hardly caused in the light emitting element of the present embodiment mode, and hence, color tone of light emitted from the light emitting layers can be controlled easily.

Embodiment Mode 3

The light emitting element of the invention as described in Embodiment Mode 1 or 2 can be applied to a pixel portion of a light emitting device having a display function or a lighting portion of a light emitting device having a lighting function.

The present embodiment mode will describe a circuit configuration of a light emitting device having a display function and a method for driving thereof with reference to FIGS. 3 to 6.

Figure 3:
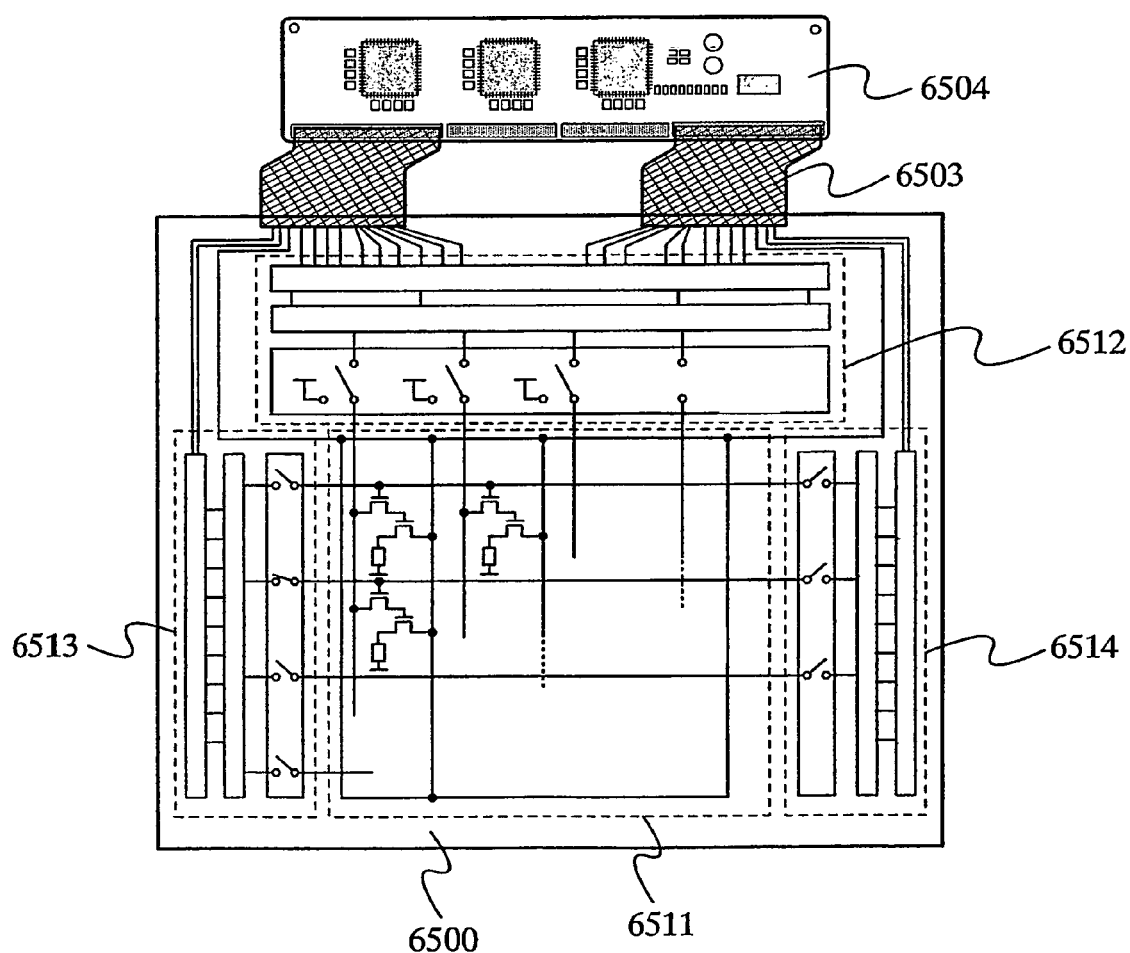
FIG. 3 is a top view showing a light emitting device according to the invention.

FIG. 3 is a schematic view seen from a top face of the light emitting device according to the invention. In FIG. 3, a pixel portion 6511, a source signal line driver circuit 6512, a writing gate signal line driver circuit 6513 and an erasing gate signal line driver circuit 6514 are provided over a substrate 6500. The source signal line driver circuit 6512, the writing gate signal line driver circuit 6513 and the erasing gate signal line driver circuit 6514 are connected to FPCs (flexible printed circuits) 6503 that are external input terminals through wiring groups, respectively. The source signal line driver circuit 6512, the writing gate signal line driver circuit 6513 and the erasing gate signal line driver circuit 6514 respectively receive video signals, clock signals, start signals, reset signals and the like from the FPCs 6503. The FPCs 6503 are attached with a printed wiring board (PWB) 6504. Further, a driver circuit portion is not necessary to be provided over the same substrate as the pixel portion 6511 as mentioned above. For example, the driver circuit portion may be provided outside of the substrate by utilizing an FPC with a wiring pattern over which an IC chip is mounted (TCP), or the like.

In the pixel portion 6511, a plurality of source signal liens extending in columns are aligned in rows. Current supply lines are aligned in rows. Also, a plurality of gate signal lines extending in rows are aligned in columns in the pixel portion 6511. Additionally, a plurality of circuits including light emitting elements are aligned in the pixel portion 6511.

Figure 4:
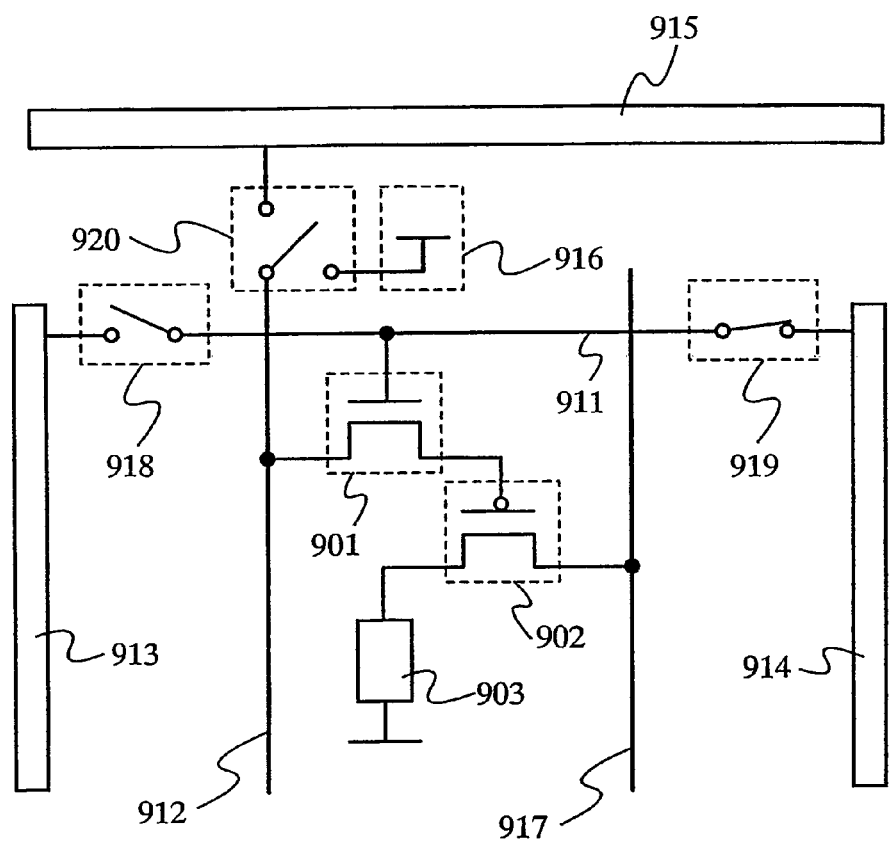
FIG. 4 is a diagram explaining a circuit included in a light emitting device according to the invention.

FIG. 4 is a diagram showing a circuit for activating one pixel. The circuit as shown in FIG. 4 comprises a first transistor 901, a second transistor 902 and a light emitting element 903.

Each of the first and second transistors 901 and 902 is a three terminal element including a gate electrode, a drain region and a source region. A channel region is provided between the drain region and the source region. The region serving as the source region and the region serving as the drain region are changed depending on a configuration of a transistor, an operational condition and the like, and therefore, it is difficult to determine which regions serve as the source region and the drain region. Accordingly, the regions serving as the source and the drain are denoted as a first electrode and a second electrode in this embodiment mode, respectively.

A gate signal line 911 and a writing gate signal line driver circuit 913 are provided to be electrically connected or disconnected to each other by a switch 918. The gate signal line 911 and an erasing gate signal line driver circuit 914 are provided to be electrically connected or disconnected to each other by a switch 919. A source signal line 912 is provided to be electrically connected to either a source signal line driver circuit 915 or a power source 916 by a switch 920. A gate of the first transistor 901 is electrically connected to the gate signal line 911. The first electrode of the first transistor is electrically connected to the source signal line 912 while the second electrode thereof is electrically connected to a gate electrode of the second transistor 902. The first electrode of the second transistor 902 is electrically connected to a current supply line 917 while the second electrode thereof is electrically connected to one electrode included in a light emitting element 903. Further, the switch 918 may be included in the writing gate signal line driver circuit 913. The switch 919 may also be included in the erasing gate signal line driver circuit 914. In addition, the switch 920 may be included in the source signal line driver circuit 915.

Figure 5:
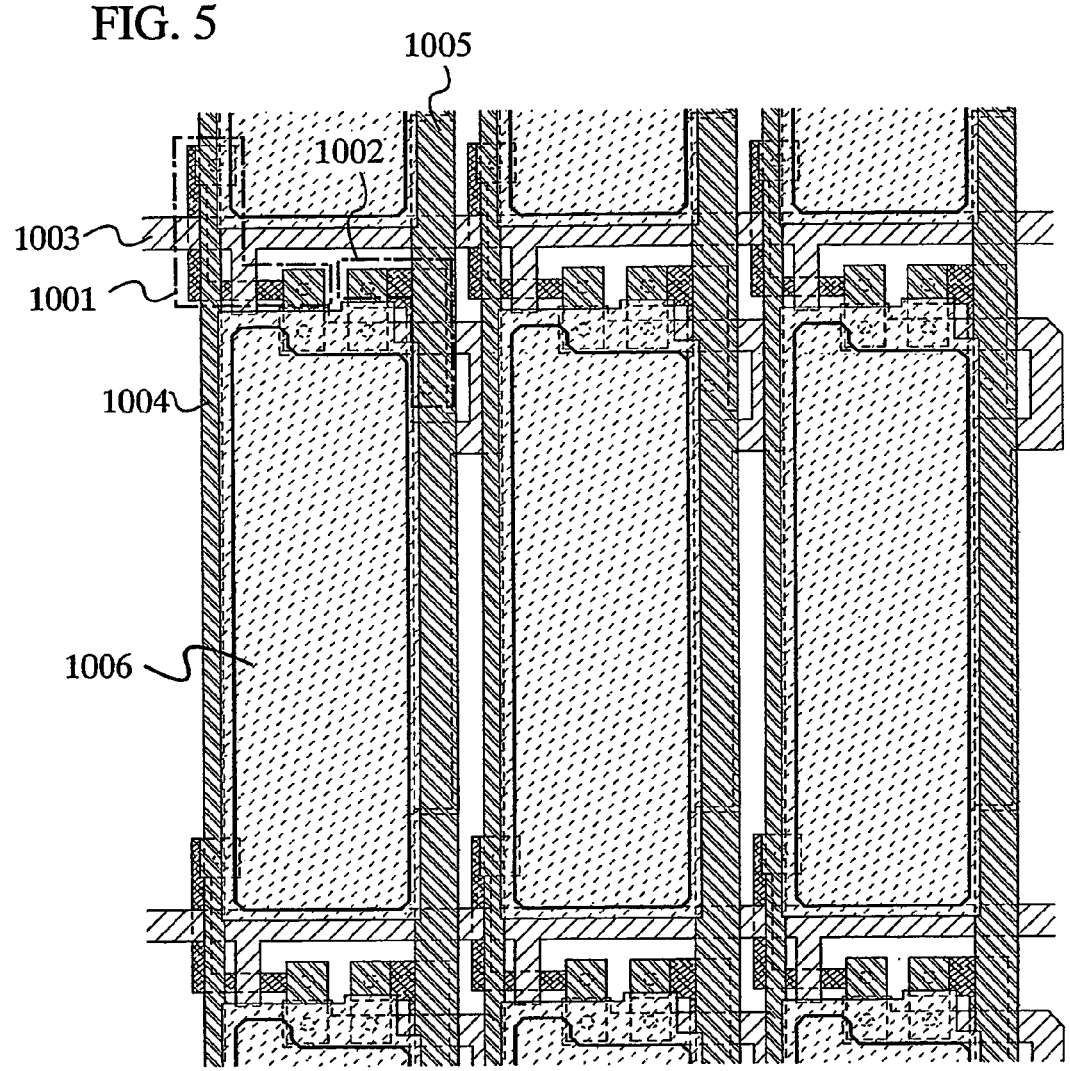
FIG. 5 is a top view of a light emitting device according to the invention.

The arrangement of the transistors, the light emitting element and the like in the pixel portion is not particularly limited. For example, the arrangement as shown in a top view of FIG. 5 can be employed. In FIG. 5, a first electrode of a first transistor 1001 is connected to a source signal line 1004 while a second electrode of the first transistor is connected to a gate electrode of a second transistor 1002. A first electrode of the second transistor is connected to a current supply line 1005 and a second electrode of the second transistor is connected to an electrode 1006 of a light emitting element. Apart of the gate signal line 1003 functions as a gate electrode of the first transistor 1001.

Figure 6:
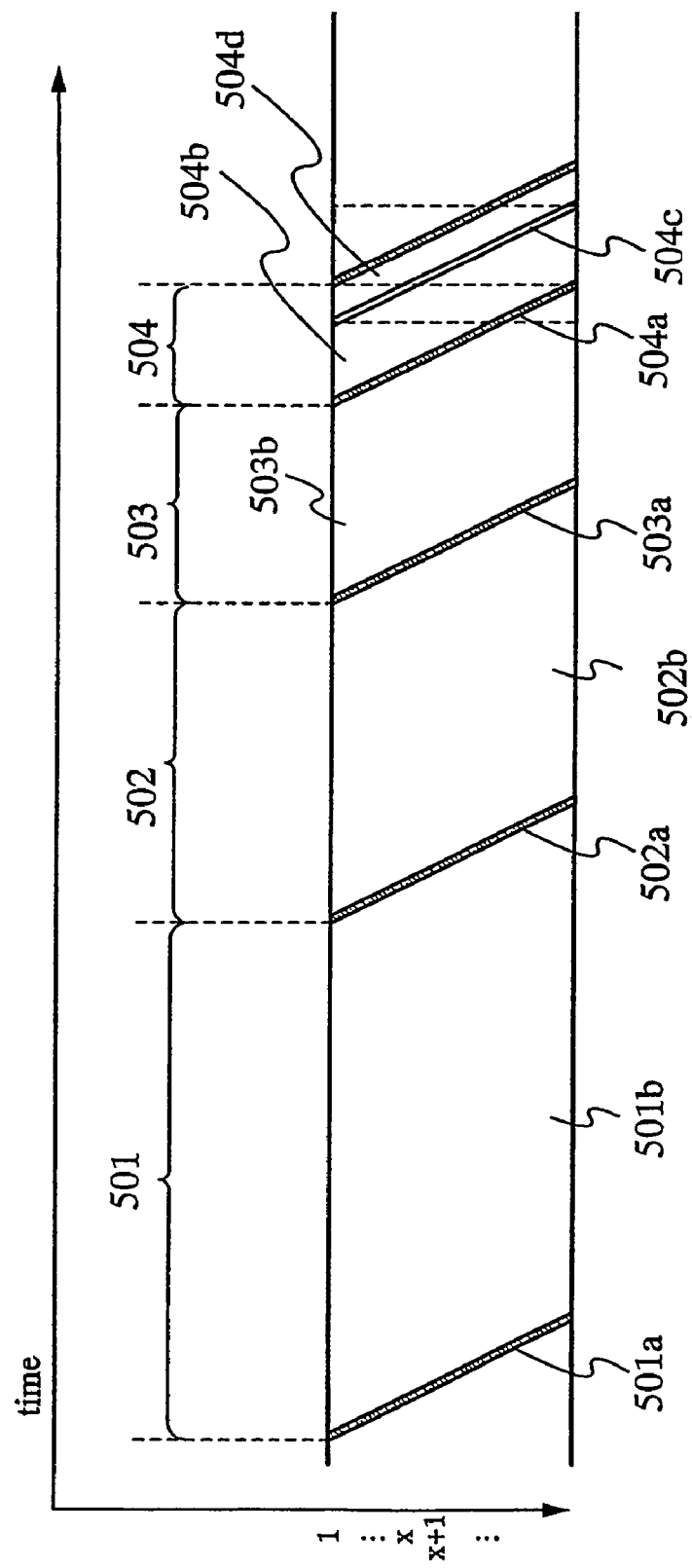
FIG. 6 is a diagram explaining a frame operation of a light emitting device according to the invention.

Next, the method for driving the light emitting device will be described. FIG. 6 is a diagram explaining an operation of a frame with time. In FIG. 6, a horizontal direction indicates time passage while a longitudinal direction indicates the number of scanning stages of a gate signal line.

When an image is displayed on the light emitting device of the invention, a rewriting operation and a displaying operation are carried out repeatedly. The number of rewriting operations is not particularly limited. However, the rewriting operation is preferably performed about 60 times a second such that a person who watches a displayed image does not detect flicker in the image. A period of operating the rewriting operation and the displaying operation of one image (one frame) is, herein, referred to as one frame period.

As shown in FIG. 6, one frame is divided into four sub-frames 501, 502, 503 and 504 including writing periods 501a, 502a, 503a and 504a and holding periods 501b, 502b, 503b and 504b. The light emitting element applied with a signal for emitting light emits light during the holding periods. The length ratio of the holding periods in each of the first sub-frame 501, the second sub-frame 502, the third sub-frame 503 and the fourth sub-frame 504 satisfies $2^3:2^2:2^1:2^0=8:4:2:1$. This allows the light emitting device to exhibit 4-bit gray scale. Further, the number of bits and the number of gray scales are not limited to those as shown in this embodiment mode. For instance, one frame may be divided into eight sub-frames so as to achieve 8-bit gray scale.

The operation in one frame will be described. In the sub-frame 501, the writing operation is first performed in $1^{st}$ row to a last row, sequentially. Therefore, the starting time of the writing periods is varied for each row. The holding period 501b sequentially starts in the rows in which the writing period 501a has been terminated. In the holding period 501b, a light emitting element applied with a signal for emitting light remains in a light emitting state. Upon terminating the holding period 501b, the sub-frame 501 is changed to the next sub-frame 502 sequentially in the rows. In the sub-frame 502, a writing operation is sequentially performed in the $1^{st}$ row to the last row in the same manner as the sub-frame 501. The above-mentioned operations are carried out repeatedly up to the holding period 504b and then terminated. After terminating the operation in the sub-frame 504, an operation in the next frame is started. Accordingly, the sum of the light-emitting time in respective sub-frames corresponds to the light emitting time of each light emitting element in one frame. By changing the light emitting time for each light emitting element and combining such the light emitting elements variously within one pixel, various display colors with different brightness and different chromaticity can be formed.

When the holding period is intended to be forcibly terminated in the row in which the writing period has already been terminated and the holding period has started prior to terminating the writing operation up to the last row as shown in the sub-frame 504, an erasing period 504c is preferably provided after the holding period 504b so as to stop light emission forcibly. The row where light emission is forcibly stopped does not emit light for a certain period (this period is referred to as a non light emitting period 504d). Upon terminating the writing period in the last row, a writing period of a next sub-frame (or, a next frame) starts sequentially from a first row. This can prevent the writing period in the sub-frame 504 from overlapping with the writing period in the next sub-frame.

Although the sub-frames 501 to 504 are arranged in order of increasing the length of the holding period in this embodiment mode, they are not necessary to be arranged in this order. For example, the sub-frames may be arranged in ascending order of the length of the holding period. Alternatively, the sub-frames may be arranged in random order. In addition, these sub-frames may further be divided into a plurality of frames. That is, scanning of gate signal lines may be performed at several times during a period of supplying same video signals.

The operations in the wiring period and the erasing period of the circuits as shown in FIG. 4 will be described.

The operation in the writing period will be described first. In the writing period, the gate signal line 911 in the $x^{th}$ row (x is a natural number) is electrically connected to the writing gate signal line driver circuit 913 via the switch 918. The gate signal line 911 in the $x^{th}$ row is not connected to the erasing gate signal line driver circuit 914. The source signal line 912 is electrically connected to the source signal line driver circuit 915 via the switch 920. In this case, a signal is input in a gate of the first transistor 901 connected to the gate signal line 911 in the $x^{th}$ row (x is a natural number), thereby turning the first transistor 901 on. At this moment, video signals are simultaneously input in the source signal lines in the first to last columns. Further, the video signals input from the source signal line 912 in each column are independent from one another. The video signals input from the source signal line 912 are input in a gate electrode of the second transistor 902 via the first transistor 901 connected to the respective source signal lines. At this moment, it is decided whether the light emitting element 903 emits light or emits no light depending on a signal input in the second transistor 902. For instance, when the second transistor 902 is a p-channel type, the light emitting element 903 emits light by inputting a low level signal in the gate electrode of the second transistor 902. On the other hand, when the second transistor 902 is an n-channel type, the light emitting element 903 emits light by inputting a high level signal in the gate electrode of the second transistor 902.

Next, the operation in the erasing period will be described. In the erasing period, the gate signal line 911 in the $x^{th}$ row (x is a natural number) is electrically connected to the erasing gate signal line driver circuit 914 via the switch 919. The gate signal line 911 in the $x^{th}$ row is not connected to the writing gate signal line deriver circuit 913. The source signal line 912 is electrically connected to the power source 916 via the switch 920. In this case, upon inputting a signal in the gate of the first transistor 901 connected to the gate signal line 911 in the $x^{th}$ row, the first transistor 901 is turned on. At this moment, erasing signals are simultaneously input in the source signal lines in the first to last columns. The erasing signals input from the source signal line 912 are input in the gate electrode of the second transistor 902 via the first transistor 901 connected to the respective source signal lines. A supply of current flowing through the light emitting element 903 from the current supply line 917 is forcibly stopped by the signals input in the second transistor 902. This makes the light emitting element 903 emit no light forcibly. For example, when the second transistor 902 is a p-channel type, the light emitting element 903 emits no light by inputting a high level signal in the gate electrode of the second transistor 902. On the other hand, when the second transistor 902 is an n-channel type, the light emitting element 903 emits no light by inputting a low level signal in the gate electrode of the second transistor 902.

Further, in the erasing period, a signal for erasing is input in the $x^{th}$ row (x is a natural number) by the above-mentioned operation. However, as mentioned above, the $x^{th}$ row sometimes remains in the erasing period while another row (e.g., a $y^{th}$ row (y is a natural number)) remains in the writing period. In this case, since a signal for erasing is necessary to be input in the $x^{th}$ row and a signal for writing is necessary to be input in the $y^{th}$ row by utilizing the source signal lines in the same columns, the after-mentioned operation is preferably carried out.

After the light emitting element 903 in the $x^{th}$ row becomes a non-light emitting state by the above-described operation in the erasing period, the gate signal line and the erasing gate signal line driver circuit 914 are immediately disconnected to each other and the source signal line is connected to the source signal line driver circuit 915 by turning the switch 920 on. The gate signal line and the writing gate signal line driver circuit 913 are connected to each other while the source signal line and the source signal line driver circuit 915 are connected to each other. A signal is selectively input in the signal line in the $y^{th}$ row from the writing gate signal line driver circuit 913 and the first transistor is turned on while signals for writing are input in the source signal lines in the first to last columns from the source signal line driver circuit 915. By inputting these signals, the light emitting element in the $y^{th}$ row emits light or no light.

After terminating the writing period in the $y^{th}$ row as mentioned above, the erasing period immediately starts in the $x+1^{th}$ row. Therefore, the gate signal line and the writing gate signal line driver circuit 913 are disconnected to each other and the source signal line is connected to the power source 916 by turning the switch 918 on/off. Also, the gate signal line and the writing gate signal line driver circuit 913 are disconnected to each other and the gate signal line is connected to the erasing gate signal line driver circuit 914. A signal is selectively input in the gate signal line in the $x+1^{th}$ row from the erasing gate signal line driver circuit 914 to input the signal in the first transistor while an erasing signal is input therein from the power source 916. Upon terminating the erasing period in the $x+1^{th}$ row in this manner, the writing period immediately starts in the $y^{th}$ row. The erasing period and the writing period may be repeated alternatively until the erasing period of the last row.

Although the writing period of the $y^{th}$ row is provided between the erasing period of the $x^{th}$ row and the erasing period of the $x+1^{th}$ row in this embodiment mode, the present invention is not limited thereto. The writing period of the $y^{th}$ row may be provided between the erasing period in the $x-1^{th}$ row and the erasing period in the $x^{th}$ row.

In this embodiment mode, when the non-light emitting period 504d is provided like the sub-frame 504, the operation of disconnecting the erasing gate signal line driver circuit 914 from one gate signal line and connecting the writing gate signal line driver circuit 913 to another gate signal line is carried out repeatedly. This operation may be performed in a frame in which a non-light emitting period is not particularly provided.

Embodiment Mode 4

An example of a cross sectional view of a light emitting device including a light emitting element of the invention will be described with reference to FIGS. 7A to 7C.

Figure 7A:
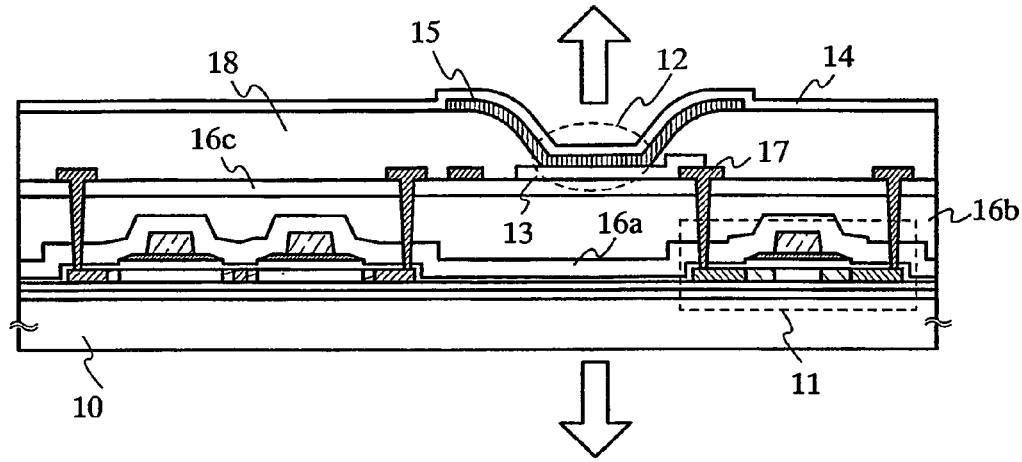
FIGS. 7A to 7C are cross sectional views of light emitting devices according to the invention.
Figure 7B:
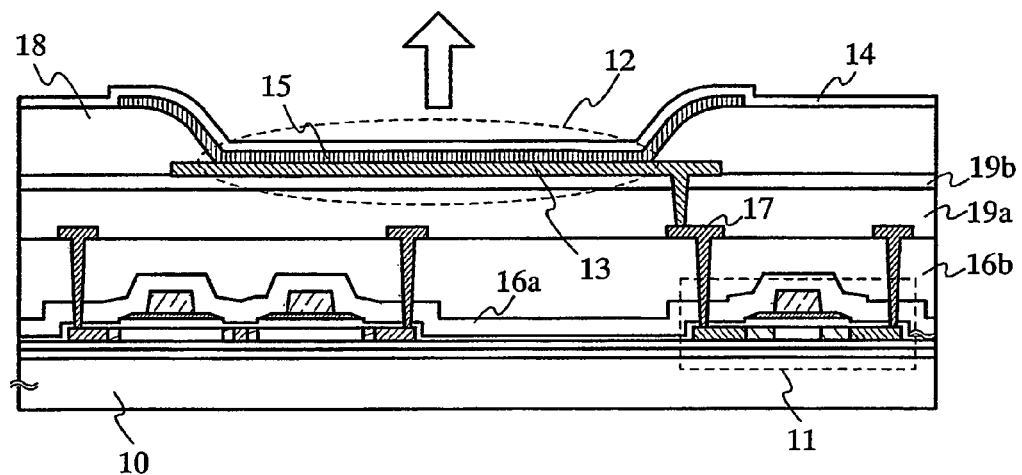
Figure 7C:
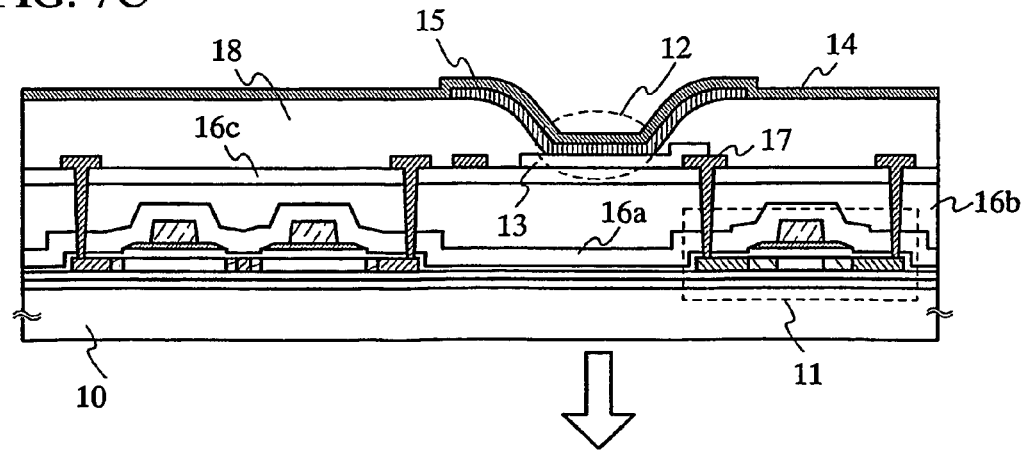

In each of FIGS. 7A to 7C, a region surrounded by a dashed line represents a transistor 11 that is provided for driving a light emitting element 12 of the invention. The light emitting element 12 of the invention comprises a layer 15 between a first electrode 13 and a second electrode 14. A drain of the transistor 11 and the first electrode 13 are electrically connected to each other by a wiring 17 passing through a first interlayer insulating film 16 (16a, 16b and 16c). The light emitting element 12 is isolated from another light emitting elements provided adjacent to the light emitting element 12 by a partition wall layer 18. The light emitting device of the invention having this structure is provided over a substrate 10 in this embodiment mode.

The transistor 11 as shown in each FIGS. 7A to 7C is a top-gate type transistor in which a gate electrode is provided on a side of a semiconductor layer opposite to the substrate. Further, the structure of the transistor 11 is not particularly limited. For example, a bottom-gate type transistor may be employed. In the case of using a bottom-gate type transistor, either a transistor in which a protection film is formed on a semiconductor layer of a channel (a channel protection type transistor) or a transistor in which a part of a semiconductor layer of a channel is etched (a channel etched type transistor) may be used.

The semiconductor layer included in the transistor 11 may be any of a crystalline semiconductor, an amorphous semiconductor, a semiamorphous semiconductor, and the like.

Concretely, a semiamorphous semiconductor has an intermediate structure between an amorphous structure and a crystalline structure (including a single crystalline structure and a polycrystalline structure), and a third condition that is stable in term of free energy. The semiamorphous semiconductor further includes a crystalline region having a short range order along with lattice distortion. A crystal grain with a size of 0.5 to 20 nm is included in at least a part of an semiamorphous semiconductor film. Raman spectrum is shifted toward lower wavenumbers than 520 cm$^{-1}$. The diffraction peaks of (111) and (220), which are believed to be derived from silicon crystal lattice, are observed in the semiamorphous semiconductor by the X-ray diffraction. The semiamorphous semiconductor contains hydrogen or halogen of at least 1 atom % or more for terminating dangling bonds. The semiamorphous semiconductor is also referred to as a microcrystalline semiconductor. The semiamorphous semiconductor is formed by glow discharge decomposition with silicide gas (plasma CVD). As for the silicide gas, $SiH_4$, $Si_2H_6$, $SiH_2Cl_2$, $SiHCl_3$, $SiCl_4$, $SiF_4$ and the like can be used. The silicide gas may also be diluted with $H_2$, or a mixture of $H_2$ and one or more of rare gas elements selected from He, Ar, Kr and Ne. The dilution ratio is set to be in the range of 1:2 to 1:1,000. The pressure is set to be approximately in the range of 0.1 to 133 Pa. The power frequency is set to be 1 to 120 MHz, preferably, 13 to 60 MHz. The substrate heating temperature may be set to be 300° C. or less, more preferably, 100 to 250° C. With respect to impurity elements contained in the film, each concentration of impurities for atmospheric constituents such as oxygen, nitrogen and carbon is preferably set to be $1 \times 10^{20}$/cm$^3$ or less. In particular, the oxygen concentration is set to be $5 \times 10^{19}$/cm$^3$ or less, preferably, $1 \times 10^{19}$/cm$^3$ or less. Further, the mobility of a TFT (thin film transistor) using an amorphous semiconductor is set to be about 1 to 10 m$^2$/Vsec.

As a specific example of a crystalline semiconductor layer, a semiconductor layer made from single crystal silicon, polycrystalline silicon, silicon germanium, or the like can be cited. These materials may be formed by laser crystallization. For example, these materials may be formed by crystallization with use of the solid phase growth method using nickel and the like.

When a semiconductor layer is made from an amorphous substance, e.g., amorphous silicon, it is preferable to use a light emitting device with circuits including only n-channel transistors as the transistor 11 and another transistor (a transistor included in a circuit for driving a light emitting element). Alternatively, a light emitting device with circuits including either n-channel transistors or p-channel transistors may be employed. Also, a light emitting device with circuits including both an n-channel transistor and a p-channel transistor may be used.

The first interlayer insulating film 16 may include plural layers (e.g., first interlayer insulating films 16a, 16b and 16c) as shown in FIGS. 7A and 7C or a single layer. The interlayer insulating film 16a is made from an inorganic material such as silicon oxide and silicon nitride. The interlayer insulating film 16b is made from acrylic, siloxane (which is a substance that has a skeleton structure formed by silicon (Si)-oxygen (O) bonds and includes at least hydrogen as its substituent), or a substance with a self-planarizing property that can be formed by applying a liquid such as silicon oxide. The interlayer insulating film 16c is made from a silicon nitride film containing argon (Ar). The substances constituting the respective layers are not particularly limited thereto. Therefore, substances other than the above-mentioned substances may be employed. Alternatively, the above-mentioned substances may be used in combination with the substance other than the above-mentioned substances. Accordingly, the first interlayer insulating film 16 may be formed by using both an inorganic material and an organic material or by using any one of inorganic and organic materials.

The edge portion of the partition wall layer 18 preferably has a shape in which the radius of curvature is continuously varied. This partition wall layer 18 is formed by using acrylic, siloxane, resist, silicon oxide, and the like. Further, the partition wall layer 18 may be made from any one of or both an inorganic film and an organic film.

FIGS. 7A and 7C show the structures in which only the first interlayer insulating films 16 are sandwiched between the transistors 11 and the light emitting elements 12. Alternatively, as shown in FIG. 7B, the first interlayer insulating film 16 (16a and 16b) and a second interlayer insulting film 19 (19a and 19b) may be provided between the transistor 11 and the light emitting element 12. In the light emitting device as shown in FIG. 7B, the first electrode 13 passes through the second interlayer insulating film 19 to be electrically connected to the wiring 17.

The second interlayer insulating film 19 may include either plural layers or a single layer as well as the first interlayer insulating film 16. The interlayer insulating film 19a is made from acrylic, siloxane (which is a substance that has a skeleton structure formed by silicon (Si)-oxygen (O) bonds and includes at least hydrogen as its substituent), or a substance with a self-planarizing property that can be formed by applying a liquid such as silicon oxide. The interlayer insulating film 19b is made from a silicon nitride film containing argon (Ar). The substances constituting the respective second interlayer insulating layers are not particularly limited thereto. Therefore, substances other than the above-mentioned substances may be employed. Alternatively, the above-mentioned substances may be used in combination with a substance other than the above-mentioned substances. Accordingly, the second interlayer insulating film 19 may be formed by using both an inorganic material and an organic material or by using any one of inorganic and organic materials.

When the first electrode and the second electrode are both formed by using a substance with a light transmitting property in the light emitting element 12, light generated in the light emitting element can be emitted through both the first electrode 13 and the second electrode 14 as shown in arrows in FIG. 7A. When only the second electrode 14 is made from a substance with a light transmitting property, light generated in the light emitting element 12 can be emitted only through the second electrode 14 as shown in an arrow of FIG. 7B. In this case, the first electrode 13 is preferably made from a material with high reflectance or a film (reflection film) made from a material with high reflectance is preferably provided under the first electrode 13. When only the first electrode 13 is made from a substance with a light transmitting property, light generated in the light emitting element 12 can be emitted only through the first electrode 13 as shown in an arrow of FIG. 7C. In this case, the second electrode 14 is preferably made from a material with high reflectance or a reflection film is preferably provided over the second electrode 14.

Moreover, the light emitting element 12 may has a structure in which the first electrode 13 servers as an anode and the second electrode 14 servers as a cathode or a structure in which the first electrode 13 serves as a cathode and the second electrode 14 serves as an anode. In the former case, the transistor 11 is a p-channel transistor. In the latter case, the transistor 11 is an n-channel transistor.

Embodiment Mode 5

Since a light emitting device according to the present invention has an excellent moisture resistant property, an electronic appliance capable of displaying images preferably for a long time or an electronic appliance capable of lighting preferably for a long time can be obtained by using the light emitting device of the invention.

Figure 8A:
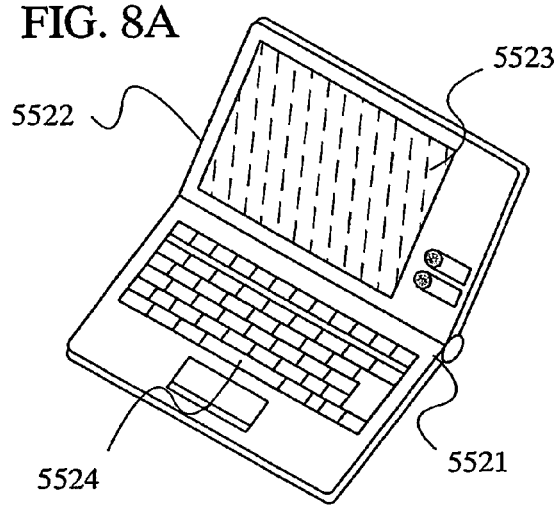
FIGS. 8A to 8C are diagrams showing electronic appliances according to the invention.
Figure 8B:
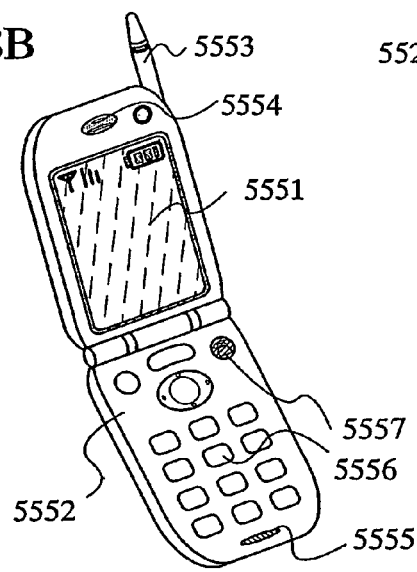
Figure 8C:
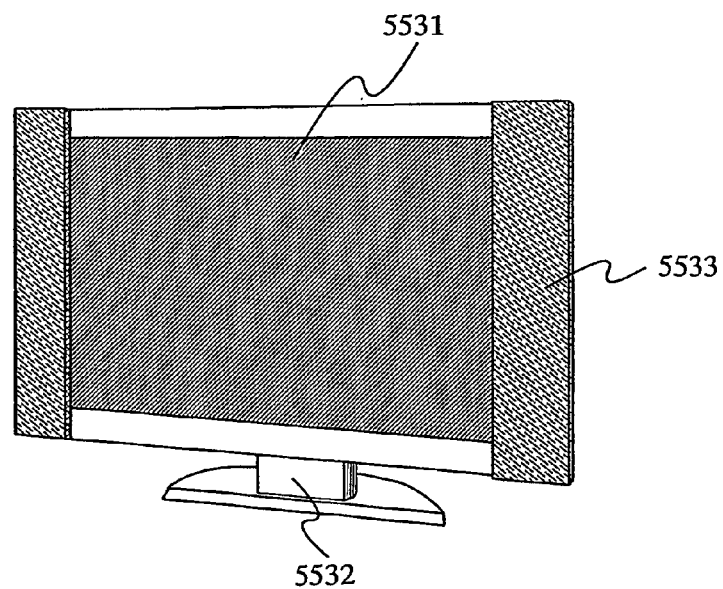

Examples of electronic appliances mounted with the light emitting devices of the invention are illustrated in FIGS. 8A to 8C.

FIG. 8A is a laptop personal computer manufactured according to the invention, including a main body 5521, a housing 5522, a display portion 5523, a keyboard 5524 and the like. The laptop personal computer can be achieved by incorporating the light emitting device including the light emitting element of the invention thereinto.

FIG. 8B is a cellular phone manufactured according to the invention, including a main body 5552, a display portion 5551, an audio output portion 5554, an audio input portion 5555, operation switches 5556 and 5557, an antenna 5553 and the like. The cellular phone can be achieved by incorporating the light emitting device including the light emitting element of the invention thereinto.

FIG. 8C is a television set manufactured according to the invention, including a display portion 5531, a housing 5532, speakers 5533 and the like. The television set can be achieved by incorporating the light emitting device including the light emitting element of the invention thereinto.

As set forth above, the light emitting devices of the invention are suitable to be used as the display portions of various kinds of electronic appliances.

Further, the light emitting devices having the light emitting elements of the invention are mounted on the laptop personal computer, the cellular phone and the television set. However, the light emitting devices having the light emitting elements of the invention can be mounted on a personal computer, a car navigation system, a lighting appliance and the like.

Embodiment 1

Figure 9:
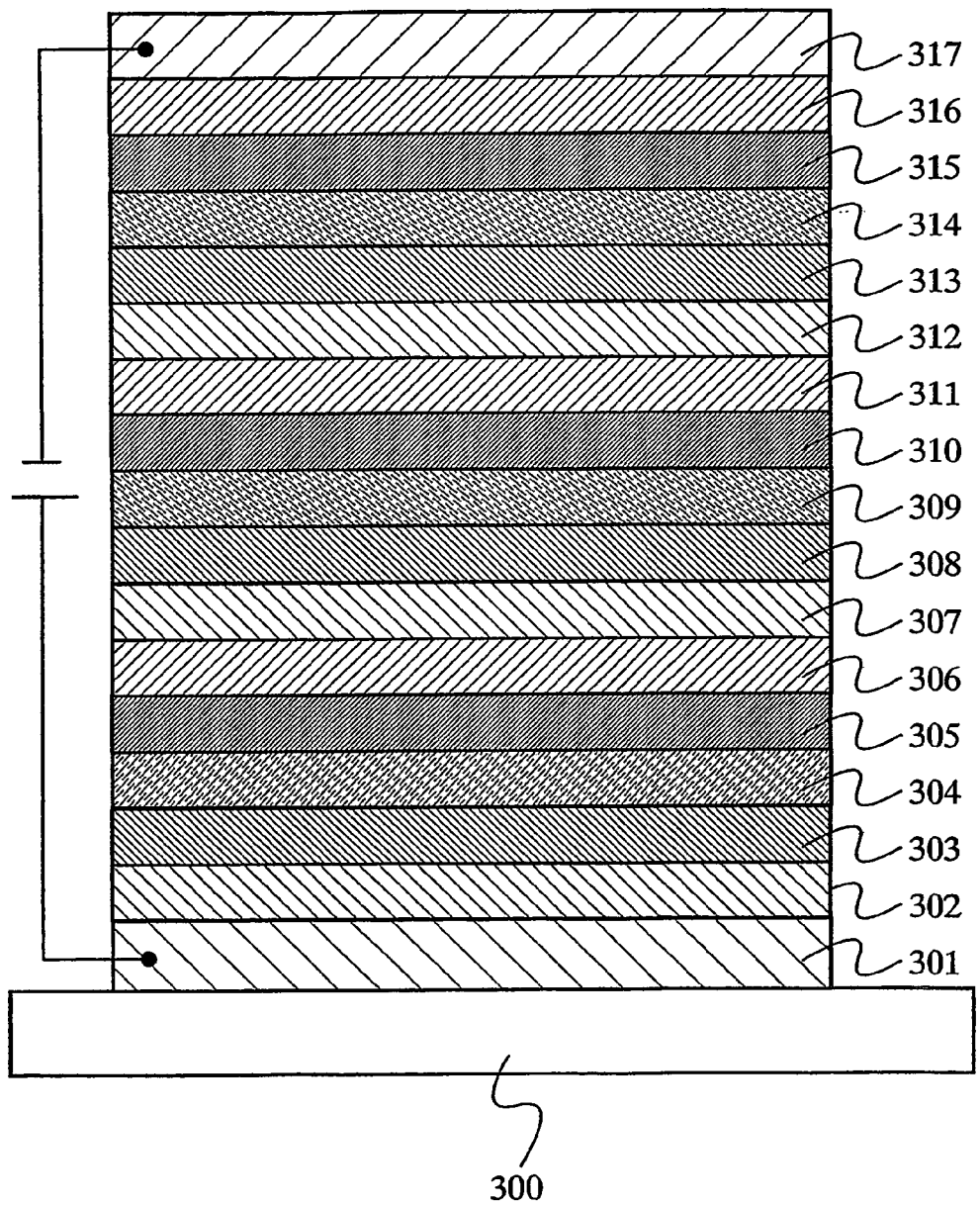
FIG. 9 is a diagram explaining a light emitting element according to the invention.

An embodiment of the invention will be described with reference to FIG. 9.

Indium tin oxide was formed to have a thickness of 110 nm over a glass substrate 301 by sputtering so as to form a layer 301 containing indium tin oxide.

A layer 302 containing α-NPD and molybdenum oxide with a thickness of 50 nm was formed over the layer 301 containing indium tin oxide by co-evaporation of α-NPD and molybdenum oxide such that the weight ratio of α-NPD to molybdenum oxide satisfied 1:0.25. Further, the co-evaporation indicates an evaporation method in which evaporation is simultaneously performed from a plurality of evaporation sources.

Next, α-NPD was formed over the layer 302 containing α-NPD and molybdenum oxide by evaporation to form a layer 303 containing α-NPD with a thickness of 10 nm.

A layer 304 containing $Alq_3$, rubrene and DCJTI with a thickness of 37.5 nm was formed over the layer 303 containing α-NPD by co-evaporation of $Alq_3$, rubrene and DCJTI such that the $Alq_3$-rubrene-DCJTI weight ratio satisfied 1:1:0.02.

Then, $Alq_3$ was formed on the layer 304 containing $Alq_3$, rubrene and DCJTI by evaporation to form a layer 305 containing $Alq_3$ with a thickness of 27.5 nm.

A layer 306 containing BCP and lithium with a thickness of 10 nm was formed over the layer 305 containing $Alq_3$ by co-evaporation of BCP and lithium (Li) such that the weight ratio of BCP to lithium satisfied 1:0.005.

A layer 307 containing α-NPD and molybdenum oxide with a thickness of 50 nm was formed over the layer 306 containing BCP and lithium by co-evaporation of α-NPD and molybdenum oxide such that the weight ratio of α-NPD to molybdenum oxide satisfied 1:0.25.

Next, α-NPD was formed over the layer 307 containing α-NPD and molybdenum oxide by evaporation to form a layer 308 containing α-NPD with a thickness of 10 nm.

A layer 309 containing $Alq_3$ and coumarin 6 with a thickness of 37.5 nm was formed over the layer 308 containing α-NPD by co-evaporation of $Alq^3$ and coumarin 6 such that the weight ratio of $Alq_3$ to coumarin 6 satisfied 1:0.005.

Next, $Alq_3$ was formed over the layer 309 containing $Alq_3$ and coumarin 6 by evaporation to form a layer 310 containing $Alq_3$ with a thickness of 27.5 nm.

A layer 311 containing BCP and lithium with a thickness of 10 nm was formed over the layer 310 containing $Alq_3$ by co-evaporation of BCP and lithium (Li) such that the weight ratio of BCP to lithium satisfied 1:0.005.

A layer 312 containing α-NPD and molybdenum oxide with a thickness of 50 nm was formed over the layer 311 containing BCP and lithium by co-evaporation of α-NPD and molybdenum oxide such that the weight ratio of α-NPD to molybdenum oxide satisfied 1:0.25.

Subsequently, α-NPD was formed over the layer 312 containing α-NPD and molybdenum oxide by evaporation to form a layer 313 containing α-NPD with a thickness of 10 nm.

Next, t-BuDNA was formed over the layer 313 containing α-NPD by evaporation to form a layer 314 containing t-BuDNA with a thickness of 37.5 nm.

$Alq_3$ was next formed over the layer 314 containing t-BuDNA by evaporation to form a layer 315 containing $Alq_3$ with a thickness of 27.5 nm.

A layer 316 containing BCP and lithium with a thickness of 10 nm was formed over the layer 315 containing $Alq_3$ by co-evaporation of BCP and lithium (Li) such that the weight ratio of BCP to lithium (Li) satisfied 1:0.005.

Subsequently, aluminum was formed over the layer 316 containing BCP and lithium by evaporation to form a layer 317 containing aluminum with a thickness of 200 nm.

In the thus-manufactured light emitting element, the layer 301 containing indium tin oxide serves as an anode and the layer 317 containing aluminum serves as a cathode.

The layer 302 containing α-NPD and molybdenum oxide has a property of injecting holes into the layer 303 containing α-NPD. Also, the layer 307 containing α-NPD and molybdenum oxide has a property of injecting holes into the layer 308 containing α-NPD. The layer 312 containing α-NPD and molybdenum oxide has a property of injecting holes into the layer 313 containing α-NPD.

The layer 303 containing α-NPD has a property of transporting the injected holes to the layer 304 containing $Alq_3$, rubrene and DCJTI. The layer 308 containing α-NPD has a property of transporting the injected holes to the layer 309 containing $Alq_3$ and coumarin 6. The layer 313 containing α-NPD serves as a hole transporting layer for transporting the injected holes to the layer 314 containing t-BuDNA.

The layer 306 containing BCP and lithium has a property of injecting electrons in the layer 305 containing $Alq_3$. Further, the layer 311 containing BCP and lithium has a property of injecting electrons to the layer 310 containing Alq₃. The layer 316 containing BCP and lithium has a property of injecting electrons into the layer 315 containing Alq₃.

The layer 305 containing Alq₃ has a property of transporting the injected electrons to the layer 304 containing Alq₃, rubrene and DCJTI. The layer 310 containing Alq₃ has a property of transporting electrons injected from the layer 311 containing BCP and lithium to the layer 309 containing Alq₃ and coumarin 6. The layer 315 containing Alq₃ serves as an electron transporting layer that transports electrons injected from the layer 316 containing BCP and lithium to the layer 314 containing t-BuDNA.

In the layers 302, 307 and 312 containing α-NPD and molybdenum oxide, molybdenum oxide serves as an electron acceptor. Further, in the layers 306, 311 and 316 containing BCP and lithium, lithium serves as an electron donor.

In this light emitting element, when applying a voltage to the layer 301 containing indium tin oxide and the layer 317 containing aluminum, current flows through the layer 301 containing indium tin oxide and the layer 317 containing aluminum. Therefore, the layer 304 containing Alq₃, rubrene and DCJTI emits light with a peak in a wavelength range of 600 to 680 nm. The layer 309 containing Alq³ and coumarin 6 emits light with a peak in a wavelength range of 500 to 550 nm. The layer 314 containing t-BuDNA emits light with a peak in a wavelength range of 420 to 480 nm. Light generated in these layers is emitted to the outside through the layer 301 containing indium tin oxide. As can be seen from the above description, in the light emitting element of this embodiment, the layer exhibiting light with a shorter wavelength of 420 to 480 nm is provided to be closer to a layer with high reflectance such as the layer 315 containing aluminum than the layer exhibiting light with a longer wavelength of 600 to 680 nm. Consequently, interference of light generated in the layers and light reflected by the layer 317 containing aluminum can be reduced.

Figure 10:
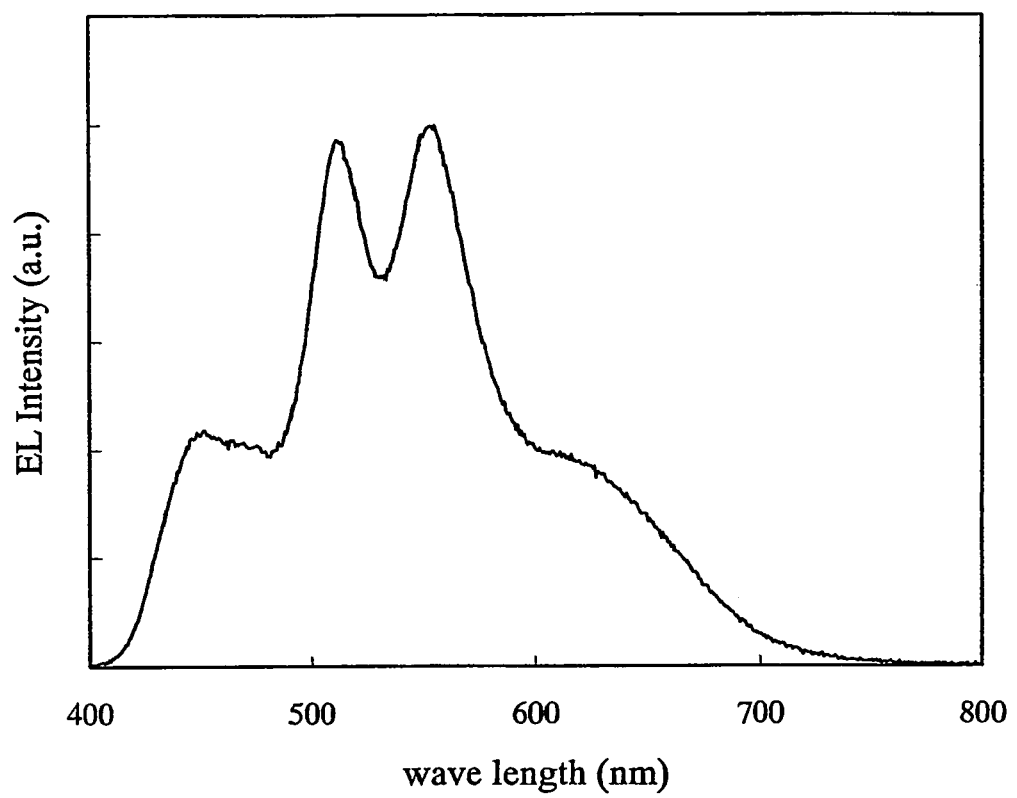
FIG. 10 is a graph showing emission spectrum of a light emitting element according to the invention.

The emission spectrums in the case where the light emitting element manufactured in this embodiment emits light will be shown in FIG. 10. In FIG. 10, a horizontal axis indicates a wavelength (nm) and a longitudinal axis indicates a emission intensity (an arbitrary unit). According to FIG. 10, it is known that the light emitting element manufactured in this embodiment emits light at a wavelength of 450 to 620 nm. The CIE chromaticity coordinate at 0.979 mA are x=0.33, y=0.46. Therefore, it is known that the light emitting element manufactured in this embodiment emits white light.

Since the light emitting element of this embodiment is manufactured by using a substance with a low moisture absorbing property such as molybdenum oxide, the light emitting element is hardly deteriorated by moisture intruding into the light emitting element. In addition, the light emitting element of this embodiment can emit white light. Moreover, interference of light emitted from the light emitting element and reflected light is hardly caused in the light emitting element of this embodiment, and hence, color tone of light emitted form the light emitting element can be controlled easily.

Embodiment 2

The present embodiment will show experimental results obtained by examining whether or not molybdenum oxide serves as a substance with an electron accepting property with respect to α-NPD.

In this experiment, three kinds of thin films, i.e., a thin film A having the same structure as the layer 302 containing α-NPD and molybdenum oxide, a thin film B containing molybdenum oxide and a thin film C containing α-NPD were formed on glass substrates respectively by vacuum evaporation. The transmission spectrums of respective thin films were compared.

Figure 11:
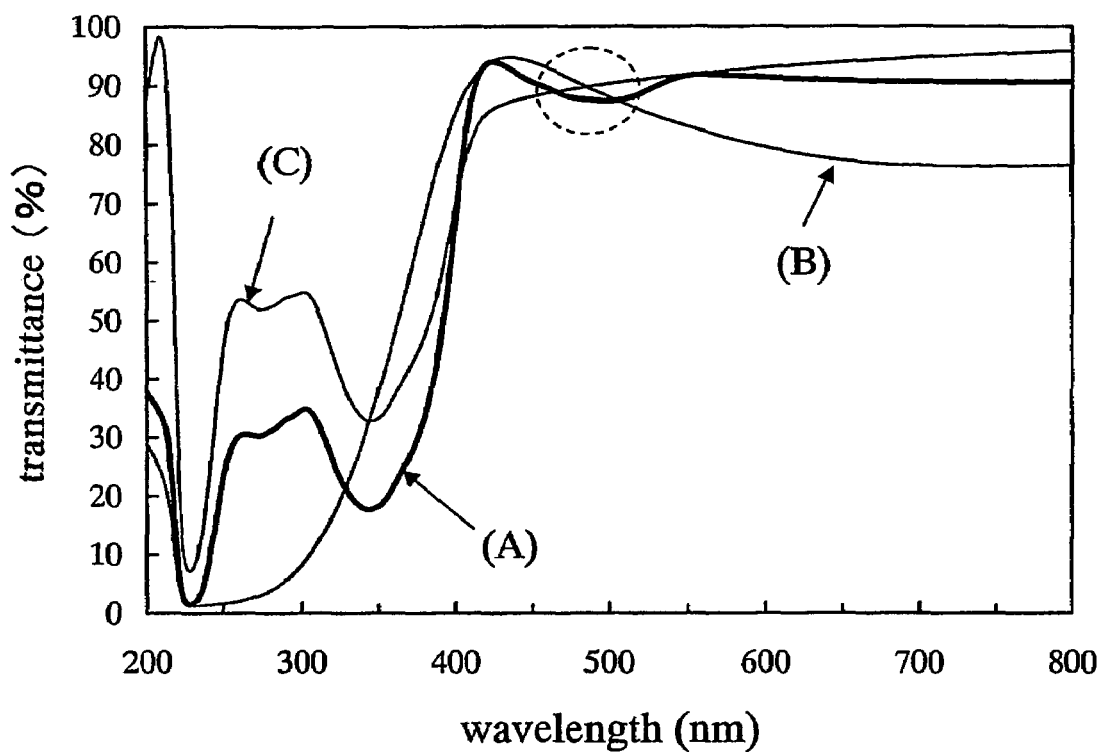
FIG. 11 is a graph showing transmission spectrum with respect to a mixed layer of molybdenum oxide and α-NPD.

The experimental results are shown in FIG. 11. A horizontal axis represents the wavelength while a perpendicular axis represents the transmittance. With respect to the thin film A having the same structure as the layer 302 (described in Embodiment 1) containing α-NPD and molybdenum oxide, a broad peak, which cannot be observed in the thin film B containing molybdenum oxide and the thin film C containing α-NPD, can be observed in the vicinity of 500 nm (a region surrounded by a dashed line in the drawing) as shown in FIG. 11. It is thought that this is an energy level that is newly generated due to electron transfer caused by transferring electrons to molybdenum oxide from α-NPD. As a consequence, it is known that molybdenum oxide exhibits an electron accepting property with respect to α-NPD.

The present application is based on Japanese Priority Application No. 2004-152491 filed on May 21, 2004 with the Japan Patent Office, the entire contents of which are hereby incorporated by reference.

The invention claimed is:

1. A light emitting element comprising:
 n pieces of light emitting layers (n is a natural number) between a first electrode and a second electrode; and
 a first layer and a second layer provided between the $m^{th}$ light emitting layer (m is a natural number of $1 \leq m \leq n$) and the $m+1^{th}$ light emitting layer, the second layer being in contact with the first layer,
 wherein the first layer contains both an aromatic amine and molybdenum oxide, and
 wherein the second layer contains both a first substance that transports an electron easily and a second substance having an electron donating property with respect to the first substance.

2. A light emitting element comprising:
 n pieces of layer groups (n is a natural number) between a pair of electrodes, each of the layer groups including:
 a first layer containing both an aromatic amine and molybdenum oxide;
 a second layer containing both a first substance that transports an electron easily and a second substance having an electron donating property with respect to the first substance;
 a light emitting layer provided between the first layer and the second layer;
 a hole transporting layer between the first layer and the light emitting layer; and
 an electron transporting layer between the second layer and the light emitting layer,
 wherein in the n pieces of layer groups, the second layer included in the $m^{th}$ layer group (m is a natural number of $1 \leq m \leq n$) and the first layer included in the $m+1^{th}$ layer group are laminated in contact with each other.

3. A light emitting element comprising:
 n pieces of light emitting layers (n is a natural number) between a first electrode and a second electrode with higher reflectance than that of the first electrode; and
 a first layer containing both an aromatic amine and molybdenum oxide and a second layer containing both a first substance that transports an electron easily and a second substance with an electron donating property with respect to the first substance between the $m^{th}$ light emitting layer (m is a natural number of $1 \leq m \leq n$) and the $m+1^{th}$ light emitting layer, the second layer being in contact with the first layer, wherein a peak wavelength of emission spectrum of the $m+1^{th}$ light emitting layer is shorter than that of the $m^{th}$ light emitting layer, and wherein the n pieces of light emitting layers are arranged such that the $m+1^{th}$ light emitting layer is placed closer to the second electrode than the $m^{th}$ light emitting layer.

4. A light emitting element comprising:

n pieces of light emitting layers between a first electrode and a second electrode with higher reflectance than that of the first electrode; and a first layer containing both an aromatic amine and molybdenum oxide and a second layer containing both a first substance that transports an electron easily and a second substance with an electron donating property with respect to the first substance between the $m^{th}$ light emitting layer (m is a natural number of $1 \leq m \leq n$) and the $m+1^{th}$ light emitting layer, the second layer being in contact with the first layer, wherein the n pieces of light emitting layers are arranged such that the light emitting layer exhibiting a shorter peak wavelength of emission spectrum is provided closer to the second electrode.

5. A light emitting element comprising:

a first layer, a second layer formed in contact with the first layer, a third layer and a fourth layer formed in contact with the third layer between a first electrode and a second electrode, wherein the first layer and the third layer contain both an aromatic amine and molybdenum oxide, and the second layer and the fourth layer contain both a first substance that transports an electron easily and a second substance with an electron donating property with respect to the first substance;

a first light emitting layer emitting red light provided between the first layer and the first electrode;

a second light emitting layer emitting green light provided between the second layer and the third layer; and a third light emitting layer emitting blue light provided between the fourth layer and the second electrode.

6. The light emitting element according to claim 5, wherein the second electrode highly reflects light compared with the first electrode.

7. A light emitting device comprising any one of light emitting elements according to claim 1 through claim 4, claim 5, or claim 6.

8. A light emitting element comprising:

at least two light emitting layers between a first electrode and a second electrode; and a first layer containing both an aromatic amine and molybdenum oxide, and a second layer containing both a first substance that transports an electron easily and a second substance with an electron donating property with respect to the first substance between a first light emitting layer and a second light emitting layer, the second layer being in contact with the first layer.

9. A light emitting element comprising:

at least two layer groups between a pair of electrodes, each of the layer groups including:

a first layer containing both an aromatic amine and molybdenum oxide;

a second layer containing both a first substance that transports an electron easily and a second substance with an electron donating property with respect to the first substance;

a light emitting layer provided between the first layer and the second layer;

a hole transporting layer between the first layer and the light emitting layer; and an electron transporting layer between the second layer and the light emitting layer, wherein in the layer groups, the first layer included in a first layer group and the second layer included in a second layer group are laminated in contact with each other.

10. A light emitting element comprising:

at least two light emitting layers between a first electrode and a second electrode with higher reflectance than that of the first electrode; and a first layer containing both an aromatic amine and molybdenum oxide and a second layer containing both a first substance that transports an electron easily and a second substance with an electron donating property with respect to the first substance between a first light emitting layer and a second light emitting layer, the second layer being in contact with the first layer, wherein a peak wavelength of emission spectrum of the second light emitting layer is shorter than that of the first light emitting layer, and wherein the light emitting layers are arranged such that the second light emitting layer is placed closer to the second electrode than the first light emitting layer.

11. A light emitting element comprising:

at least two light emitting layers between a first electrode and a second electrode with higher reflectance than that of the first electrode; and a first layer containing both an aromatic amine and molybdenum oxide and a second layer containing both a first substance that transports an electron easily and a second substance with an electron donating property with respect to the first substance between a first light emitting layer and a second light emitting layer, the second layer being in contact with the first layer, wherein the light emitting layers are arranged such that the light emitting layer exhibiting a shorter peak wavelength of emission spectrum is provided closer to the second electrode.

12. A light emitting device comprising the light emitting element according to any one of claim 8 through claim 11.

* * * * *